United States Patent
Sung et al.

(10) Patent No.: US 9,129,835 B2
(45) Date of Patent: Sep. 8, 2015

(54) SEMICONDUCTOR DEVICE AND METHOD OF MANUFACTURING THE SAME

(71) Applicant: Samsung Electronics Co., Ltd., Suwon-Si, Gyeonggi-Do (KR)

(72) Inventors: Woong-je Sung, Hwaseong-si (KR); Chang-yong Um, Seoul (KR); Jai-kwang Shin, Anyang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 113 days.

(21) Appl. No.: 13/868,490

(22) Filed: Apr. 23, 2013

(65) Prior Publication Data

US 2014/0097448 A1    Apr. 10, 2014

(30) Foreign Application Priority Data

Oct. 8, 2012 (KR) .................. 10-2012-0111385

(51) Int. Cl.
| | |
|---|---|
| H01L 29/76 | (2006.01) |
| H01L 29/94 | (2006.01) |
| H01L 27/088 | (2006.01) |
| H01L 21/82 | (2006.01) |
| H01L 21/8232 | (2006.01) |
| H01L 21/04 | (2006.01) |
| H01L 29/78 | (2006.01) |

(52) U.S. Cl.
CPC ............ *H01L 27/088* (2013.01); *H01L 21/049* (2013.01); *H01L 21/0455* (2013.01); *H01L 21/0475* (2013.01); *H01L 21/8213* (2013.01); *H01L 21/8232* (2013.01); *H01L 29/7827* (2013.01)

(58) Field of Classification Search
CPC ..................... H01L 21/8213; H01L 27/088
USPC .................. 257/77, 341–342; 438/270
See application file for complete search history.

(56) References Cited

U.S. PATENT DOCUMENTS

| | | | |
|---|---|---|---|
| 5,814,859 A | 9/1998 | Ghezzo et al. | |
| 6,057,558 A * | 5/2000 | Yamamoto et al. | ............. 257/77 |
| 6,355,944 B1 | 3/2002 | Alok | |
| 7,271,052 B1 | 9/2007 | Forbes | |
| 7,381,992 B2 | 6/2008 | Ryu | |
| 2002/0139992 A1 * | 10/2002 | Kumar et al. | ................. 257/134 |

FOREIGN PATENT DOCUMENTS

KR    20100034440 A    4/2010

* cited by examiner

*Primary Examiner* — Theresa T Doan

(74) *Attorney, Agent, or Firm* — Harness, Dickey & Pierce, P.L.C.

(57) ABSTRACT

A semiconductor device includes a drift layer including a trench formed on a semiconductor substrate. A well in the drift layer overlaps an edge of the trench, and at least one gate electrode is formed at this overlapping edge region. The drift layer and semiconductor may be doped with a first type of impurity and the well may be doped with a second type of impurity. Through this arrangement, an improved distribution of carriers may be formed in the drift layer.

19 Claims, 4 Drawing Sheets

SEMICONDUCTOR DEVICE AND METHOD OF MANUFACTURING THE SAME

CROSS-REFERENCE TO RELATED APPLICATIONS

This application claims the benefit of Korean Patent Application No. 10-2012-0111385, filed on Oct. 8, 2012, in the Korean Intellectual Property Office, the disclosure of which is incorporated herein in its entirety by reference.

BACKGROUND

1. Field

The present disclosure relates to a semiconductor device.

2. Related Art

A power semiconductor device for handling electric power from hundreds of kilowatts (KW) to several megawatts (MW) has been used to construct an inverter circuit for an industrial motor or an automotive motor, a power apparatus for a large capacity server, and an uninterruptible power supply (UPS).

One type of a power semiconductor device uses a metal-oxide-semiconductor field effect transistor (MOSFET) semiconductor switch designed to have low on-resistance and a high breakdown voltage. Some of these MOSFETs have a gate electrode in a trench, where the gate electrode is self-aligned to allow the MOSFET to occupy a relatively small area. However, in these devices, an electric field concentrates on a portion of the gate electrode at an edge of the trench. This electric field may lower the breakdown voltage of the device.

SUMMARY

According to an example embodiment, a power metal-oxide-semiconductor field effect transistor (MOSFET) is provided to have a trench gate, in which the concentration of an electric field on a corner or edge portion of a gate electrode arranged in a trench is prevented or reduced.

According to an example embodiment, a method is provided for manufacturing a power MOSFET having a trench gate by which a self-aligned source region and a trench gate are formed.

According to an example embodiment, a power MOSFET includes a semiconductor substrate doped with a first type impurity, a drift layer on the semiconductor substrate, doped with the first type impurity, and having an upper surface in which a trench is formed, a well in a surface of the drift layer under a bottom of the trench and doped with a second type impurity, a source region in a surface of the well and doped with the first type impurity, a gate insulation layer on the trench, a gate electrode on the gate insulation layer extending from a side wall of the trench over a portion of the source region, a source electrode on the source region to be separated from the gate electrode, and a drain electrode formed on a lower surface of the semiconductor substrate. The semiconductor substrate may be formed of silicon carbide.

The well may overlap an edge of the trench, where the overlap between the well and edge of the trench may produce a uniform distribution of carriers in the well. The edge may include a corner of the trench.

The gate electrode may have a shape of a side wall spacer having a height that decreases as a distance from the side wall of the trench increases. The first type impurity may be an n-type impurity and the second type impurity may be a p-type impurity. The trench may have a width larger than a depth.

The gate electrode may include a pair of gate electrodes facing each other with the source electrode interposed therebetween and the pair of gate electrodes may be electrically connected to each other.

The source region may be self-aligned to the well and the gate electrode may be self-aligned to the well and the source region.

The trench may include a plurality of trenches and the power MOSFET may further includes a source electrode pad connecting the plurality of source electrodes in the plurality of trenches and a gate electrode pad connecting the plurality of gate electrodes in the plurality of trenches. The source electrode pad and the gate electrode pad may be arranged on a substantially same plane.

According to an example embodiment, a method of manufacturing a power MOSFET includes forming a drift layer doped with a first type impurity on a semiconductor substrate doped with the first type impurity by epitaxially growth, forming a trench by etching a surface of the drift layer, forming a well doped with a second type impurity in the drifty layer that is exposed to the trench, forming a self-aligned source region doped with the first type impurity in a surface of the well, forming a pair of gate electrodes facing each other on opposite side walls of the trench, forming a source electrode on the source region, and forming a drain electrode on a lower surface of the semiconductor substrate.

The forming of the trench may include forming the trench such that a width thereof is larger than a depth thereof. The forming of the self-aligned source region may include forming an oxide film having a first thickness on the drift layer, forming a first side wall spacer on each of side walls facing each other in the trench by dry etching the oxide film, and forming the self-aligned source region by doping the first type impurity on the well exposed to the first side wall spacer.

The forming of the pair of gate electrodes may include removing the first side wall spacer, forming a gate insulation layer on the drift layer and the trench, forming a polysilicon layer to a second thickness on the gate insulation layer, and forming a pair of second side wall spacers formed of polysilicon on opposite side walls of the trench by dry etching the polysilicon layer, wherein the second thickness is larger than the first thickness. The forming of the gate insulation layer may include performing a thermal treatment on the drift layer.

According to another example embodiment, a transistor comprises a drain, a source over the drain, a drift layer between the drain and source, a well between the drift layer and source, and a first gate electrode overlapping the source, well and drain, the gate and source located in a trench of the drift layer and the well overlapping an edge region of the trench. The edge region may include a corner of the trench, and an insulation layer may be between the first gate electrode and the well and source. Also, the well may have a width substantially equal to a width of the trench in the drift layer, and the source may have a width less than widths of the trench and well.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF EXAMPLE EMBODIMENTS

Figure 1:
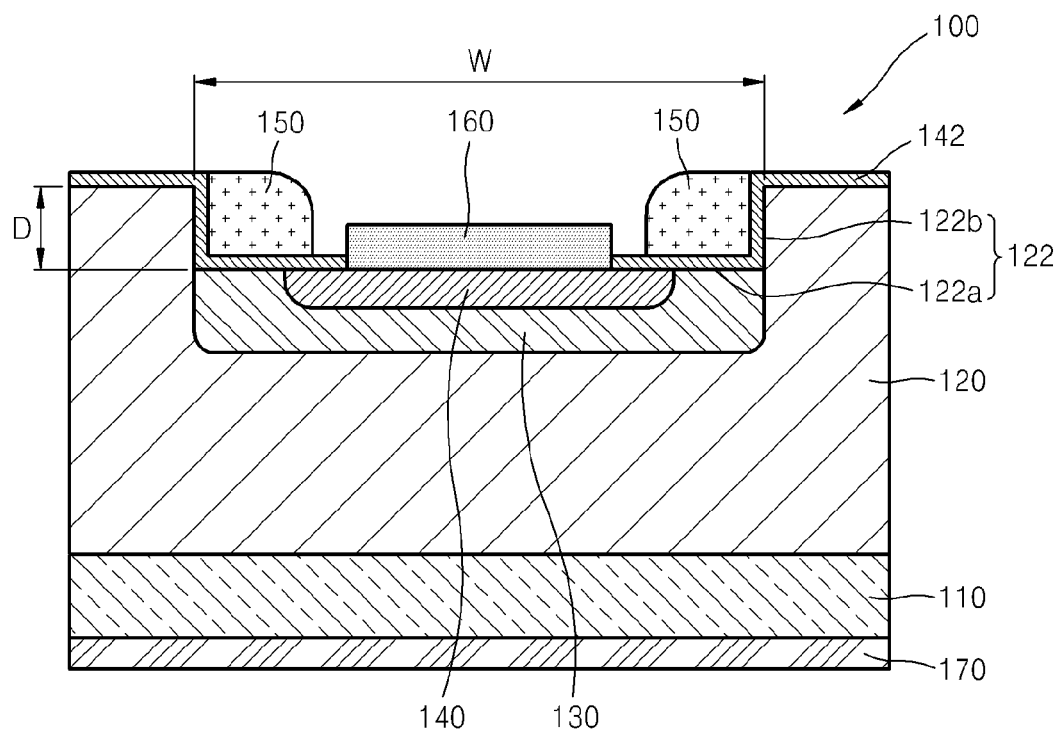
FIG. 1 shows an example embodiment of a semiconductor device.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

In the drawings, it is understood that the thicknesses of layers and regions may be exaggerated for clarity. It will also be understood that when a layer is referred to as being "on" another layer or substrate, it can be directly on the other layer or substrate or intervening layers may also be present. Like reference numerals in the drawings denote like elements, and thus their description will not be repeated. As used herein, the term "and/or" includes any and all combinations of one or more of the associated listed items. Expressions such as "at least one of," when preceding a list of elements, modify the entire list of elements and do not modify the individual elements of the list.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a cross-sectional view of an example embodiment of a semiconductor device in the form of a power MOSFET 100 having a trench gate. The power MOSFET 100 may use electrons or holes as a main carrier. For convenience of explanation, an example embodiment of a power MOSFET 100 using electrons as a main carrier will be described.

Referring to FIG. 1, an n drift layer 120 is formed on an n+ semiconductor substrate 110 that is a drain region. The n drift layer 120 may, for example, be a layer that is epitaxially grown on the n+ semiconductor substrate 110. A trench 122 is formed in the n drift layer 120. According to an example embodiment, the trench 122 may be formed to have a width W larger than a depth D. In other embodiments, the W may be less than or equal to D. Also the n+ semiconductor substrate 110 may be thicker than the n drift layer 120 in some embodiments, while in other embodiments such as shown in FIG. 1 the n drift layer 120 may be thicker than the n+ semiconductor substrate 110.

The n+ semiconductor substrate 110 and the n drift layer 120 are formed of a semiconductor material. For example, the n+ semiconductor substrate 110 may be formed of silicon carbide (SiC), silicon (Si), gallium arsenide (GaAs), germanium (Ge), gallium nitride (GaN), etc. Phosphor (P) or nitrogen (N) may, for example, be used as an n-type impurity. The concentration of impurity of the n+ semiconductor substrate 110 may be about $10^{19} \sim 10^{20}/cm^3$, and the concentration of impurity of the n drift layer 120 may be about $10^{14} \sim 10^{17}/cm^3$. In other embodiments, one or more of these concentrations may lie in different ranges.

A p-well 130 is formed in a lower portion of the trench 122. The p-well 130 may be doped with a p-type impurity, for example, aluminum (Al), at a concentration of about $10^{16} \sim 10^{18}/cm^3$.

An n+ source region 140 is formed in the p-well 130. According to example embodiments, the n+ source region 140 may be formed on a surface of the p-well 130 by being self-aligned. The n+ source region 140 may be doped with an n-type impurity at a concentration of about $10^{19} \sim 10^{20}/cm^3$. In other embodiments, source region 140 may have a different concentration. An upper surface of the n+ source region 140 and an upper surface of the p-well 130 may be exposed to the trench 122.

A gate insulation layer 142 is formed on a surface of the trench 122. The gate insulation layer 142 may be formed on a side wall 122b of the trench 122, the upper surface of the p-well 130, and a part of an upper surface of the n+ source region 140 adjacent to the upper surface of the p-well 130. The gate insulation layer 142 may be formed of silicon oxide or another insulation material.

At least one gate electrode 150 is formed at a corner of the trench 122 to extend from the side wall 122b of the trench 122 toward the n+ source region 140. In another example embodiment, a pair of gate electrodes 150 are formed at respective side walls 122b facing each other and parallel to each other. The gate electrodes 150 facing each other may be connected by a gate electrode pad 152 (FIG. 2) which is described below. The gate electrode 150 may be referred to as a trench gate and may be formed, for example, of polysilicon.

The gate electrode 150 may be an electrode having a side wall spacer shape that extends from the side wall 122b of the trench 122. According to an example embodiment, the gate electrode 150 has a shape such that the height thereof decreases as a distance from the side wall 122b increases. In other example embodiments, the gate electrode may have a different tapered shape, a curved shape, or an extended shape.

A source electrode 160 may be arranged on the n+ source region 140 to be separated from the gate electrode 150 on a bottom 122a of the trench 122. The source electrode 160 may be formed between the pair of gate electrodes 150 and may have a length extending in the same direction as the gate electrodes 150 greater than its width or height. As shown, the pair of gate electrodes 150 may be formed facing each other with the source electrode 160 interposed therebetween.

A drain electrode 170 may be formed under the n+ semiconductor substrate 110. The source electrode 160 and the drain electrode 170 may be formed, for example, of aluminum (Al), gold (Au), beryllium (Be), bismuth (Bi), cobalt (Co), copper (Cu), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), tungsten (W), zinc (Zn), or zirconium (Zr).

When a threshold voltage is applied to the gate electrode 150, electrons are inversed on a surface of the p-well 130 under the gate electrode 150, forming a channel. The electrons injected from the source electrode 160 move toward the drain electrode 170 through the channel.

Figure 2:
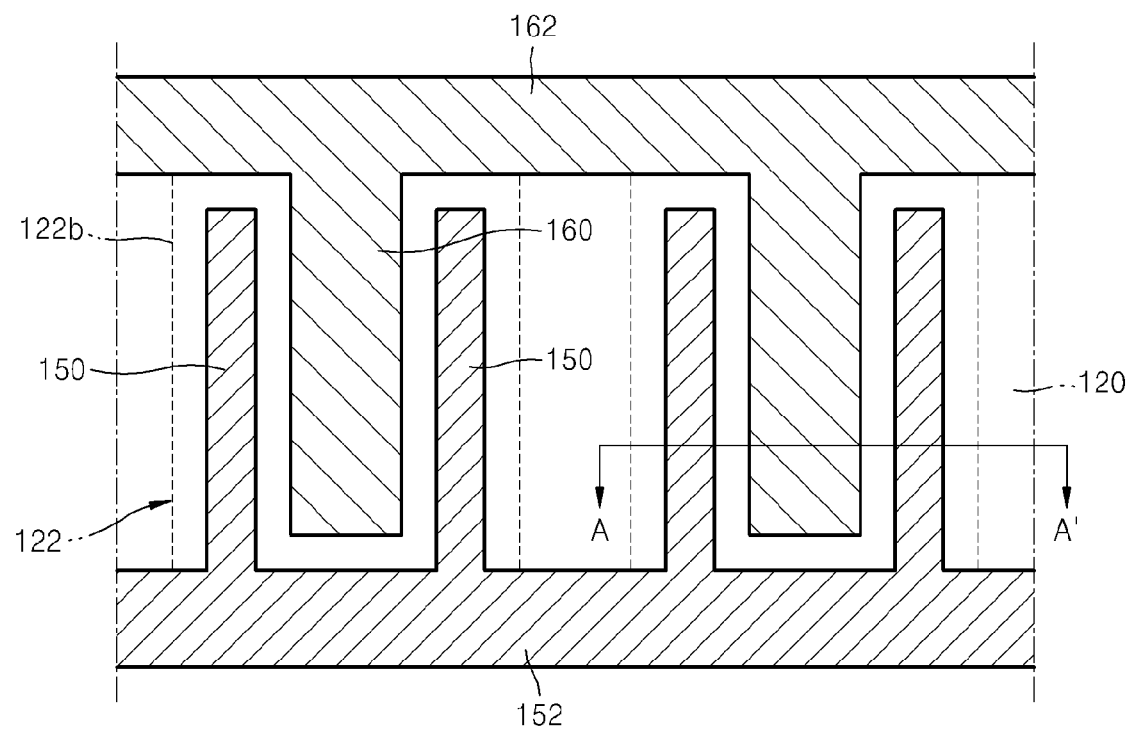
FIG. 2 shows an arrangement of electrodes in the device of FIG. 1.

FIG. 2 is a partial plan view schematically illustrating an example arrangement of electrodes in the power MOSFET 100 having a trench gate. In FIG. 2, some constituent elements are omitted for convenience of explanation. Also, FIG. 1 may be a cross-sectional view taken along line A-A' of FIG. 2. In FIGS. 1 and 2, like reference numerals are used for like constituent elements and descriptions thereof will be omitted.

Referring to FIG. 2, the trenches 122 are formed to be parallel in the n drift layer 120 facing each other. Two gate electrodes 150 are formed in each trench 122 close to the side wall 122b of the trench 122 and facing each other. The gate electrodes 150 are connected to the gate electrode pad 152 formed at one side of the gate electrodes 150. In one example embodiment, the gate electrodes 150 are finger electrodes connected to the gate electrode pad 152.

The source electrodes 160 may be arranged parallel to the gate electrode 150 between the two gate electrodes 150 facing each other in the trench 122. The source electrodes 160 are connected to a source electrode pad 162. The source electrodes 160 may also be a finger electrodes (or an electrode having another shape or arrangement) connected to the source electrode pad 162.

The source electrodes 160 and the gate electrodes 150 may be formed on substantially the same plane. Or, upper and and/or lower surface of the gate electrodes and source electrodes may reside in different planes with different widths, lengths, and/or thicknesses. Also, the source electrode pad 162 and the gate electrode pad 152 may be formed on the substantially the same or different planes as the source electrode 160 and the gate electrode 150.

Although two trenches 122 are shown in FIG. 2 for convenience of explanation, power MOSFET 100 may have one or more than two trenches in other example embodiments. In other words, one trench 122 or three or more trenches 122 may be formed in the n drift layer 120. Also, each trench may include a source electrode 160 extending from the source electrode pad 162 and a pair of gate electrodes 150 extending from the gate electrode pad 152 and facing each other.

When a p+ semiconductor substrate is used instead of the n+ semiconductor substrate 110 in the power MOSFET 100 of FIG. 1 without changing the other structures, the power MOSFET 100 may form an insulated gate bipolar transistor (IGBT).

Also, in an example embodiment, gate electrode 150 may be self-aligned using the trench 122. Also, since the p-well 130 is formed under the trench 122, a disproportionate or non-uniform concentration of an electric field at the bottom of, under one or more corners of, or at one or more edges of the trench 122 may be prevented or reduced. Thus, according to example embodiments, a trench-type power MOSFET 100 may be formed to have a low on-resistance and maintains a high breakdown voltage, which may prove useful for one or more types of high voltage power devices.

FIGS. 3A through 3F schematically illustrate an example embodiment of a method of manufacturing a semiconductor device, which, for example, may be a power MOSFET having a trench gate. The power MOSFET may be an n type or a p type transistor and the following description focuses on a method of manufacturing an n type transistor for convenience of explanation.

Figure 3A:
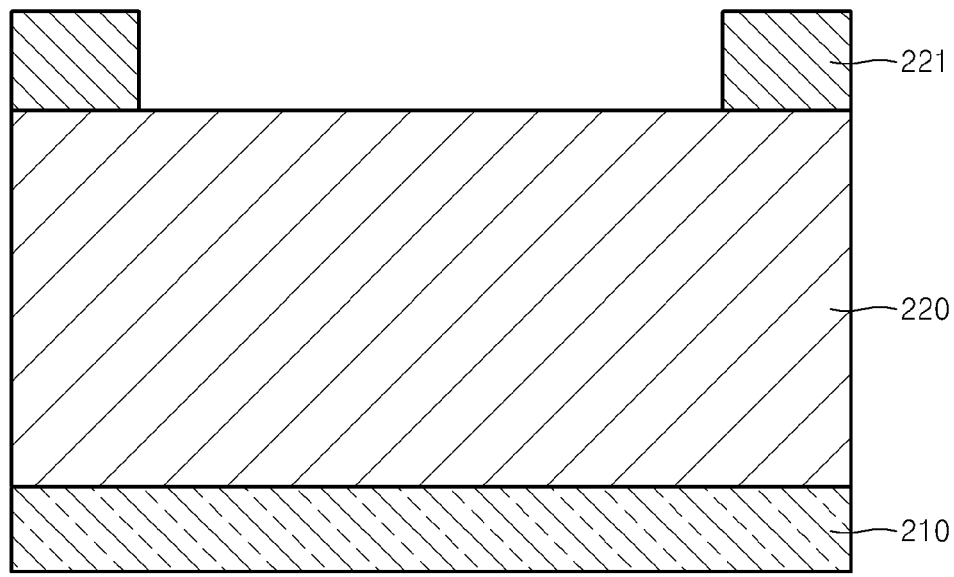
FIGS. 3A through 3F shows an example embodiment of a method of manufacturing a semiconductor device.

Referring to FIG. 3A, a semiconductor substrate 210 doped with an n-type impurity at a relatively high concentration is provided. Phosphor (P) or nitrogen (N) may be used as an n-type impurity. In one example embodiment, a doping concentration may be about $10^{19} \sim 10^{20}/cm^3$. In other embodiments, a different concentration may be used.

The semiconductor substrate 210 may be formed of a semiconductor material, for example, silicon carbide (SiC), silicon (Si), gallium arsenide (GaAs), germanium (Ge), or gallium nitride (GaN). In the following example description, the semiconductor substrate 210 is formed of silicon carbide (SiC) for illustrative purposes.

An n drift layer 220 is epitaxially grown on the semiconductor substrate 210. The n drift layer 220 may be doped with an n-type impurity at a relatively low concentration, for example, of about $10^{14} \sim 10^{17}/cm^3$. In other embodiments, the doping concentration may be different.

A pattern 221 for trench etching is formed on the n drift layer 220. On example procedure for forming the pattern 221 involves forming a silicon oxide layer on the n drift layer 220 and then etching or otherwise patterning the silicon oxide layer to form the pattern 221.

Figure 3B:
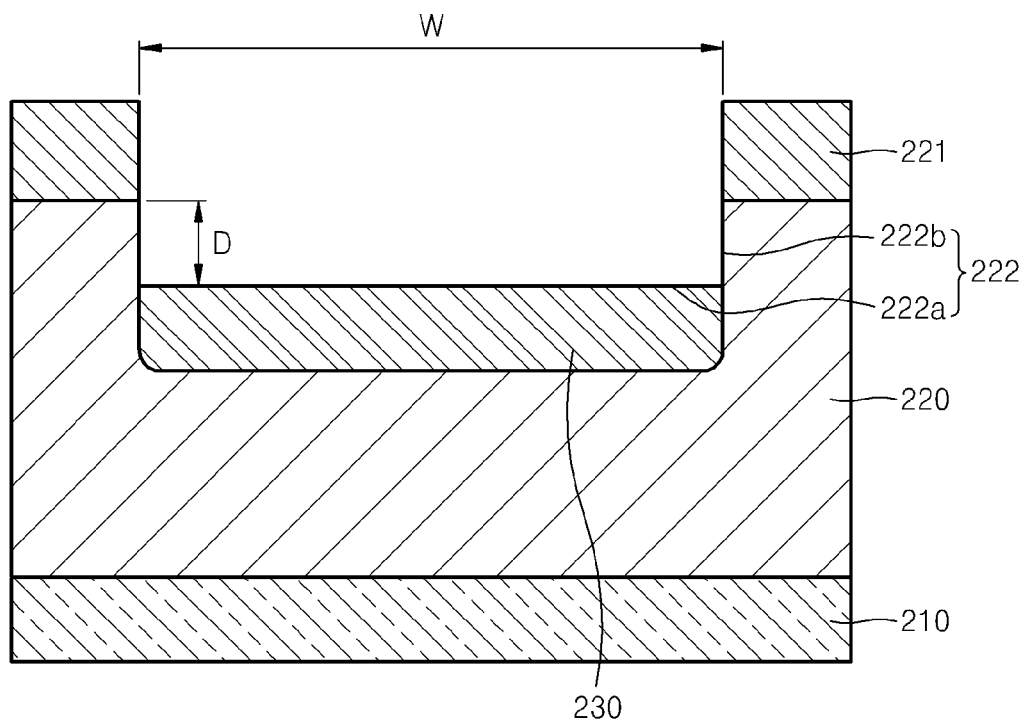

Referring to FIG. 3B, a trench 222 having a predetermined depth is formed by dry etching an exposed portion of the n drift layer 220, by using the pattern 221 as a mask. The width W of the trench 222 may be larger than the depth D of the trench 222, or the depth may be equal to or greater than the width. Also, a technique different from dry etching may be used in this step.

A p-well 230 is formed by doping a bottom 222a of the trench 222 with a p-type impurity, for example, aluminum (Al) at a concentration of about $10^{16} \sim 10^{18}/cm^3$.

Figure 3C:
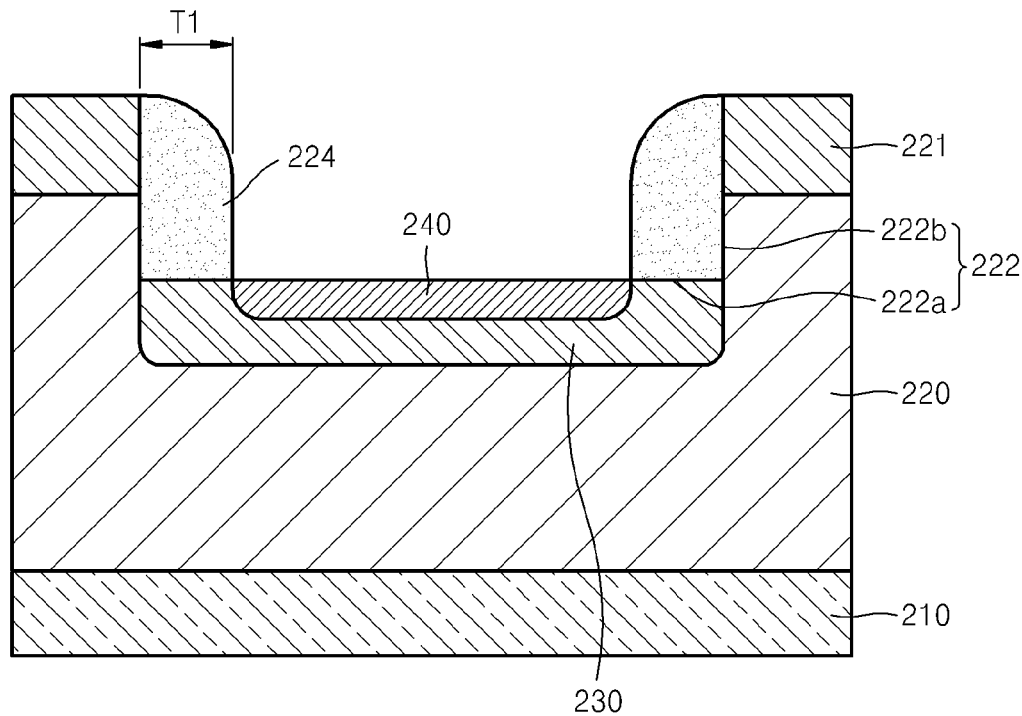

Referring to FIG. 3C, an oxide layer may be deposited on the n drift layer 220 to a first thickness T1. The oxide layer may be formed of the same material as the pattern 221 or a different material. Next, the oxide layer is dry etched to expose the bottom 222a of the trench 222. Two side wall spacers 224 are formed on the opposite side walls 222b of the trench 222. The width of the side wall spacer 224 may be substantially the same as the first thickness T1. In other words, the first thickness T1 that is the deposition thickness of the oxide layer may control a width of the p-well 230 to be exposed.

An n+ source region 240 is formed by doping a surface of the p-well 230 that is exposed with an n-type impurity at a concentration of, for example, about $10^{19}$~$10^{20}$/cm$^3$. The n+ source region 240 is self-aligned at a center position of the p-well 230 by the side wall spacer 224.

Figure 3D:
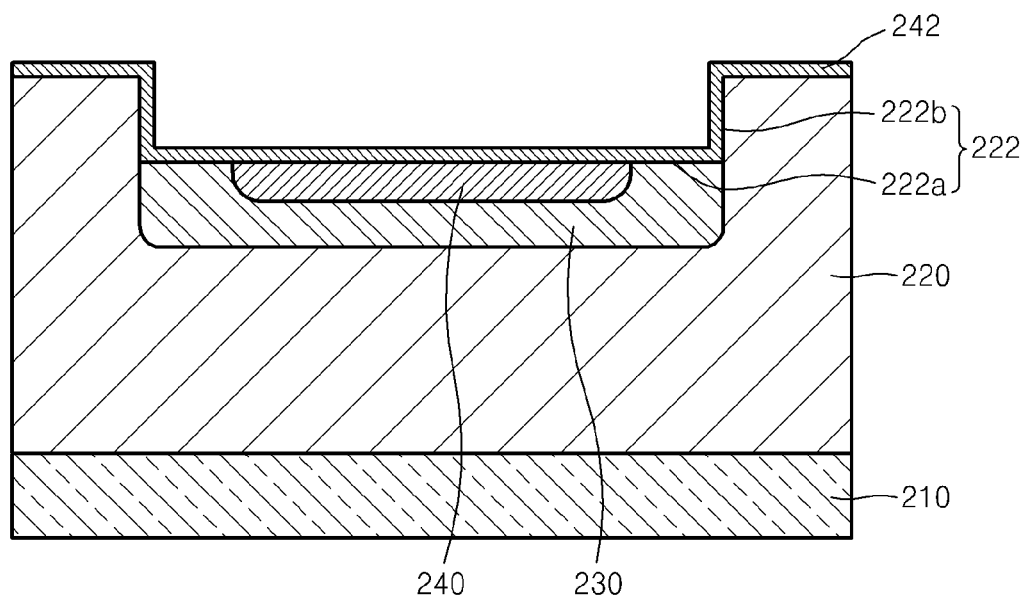

Referring to FIG. 3D, the pattern 221 on the n drift layer 220 and the side wall spacer 224 are removed by wet etching. A gate insulation layer 242 is formed on the n drift layer 220. The gate insulation layer 242 may be formed on the surface of the exposed n drift layer 220, the p-well 230, and the n+ source region 240 after the n drift layer 220 is thermally treated at, for example, about 1600~1800° C. The temperature and time of thermal treatment may vary according to a material of the n drift layer 220. The gate insulation layer 242 may be a silicon oxide layer.

Figure 3E:
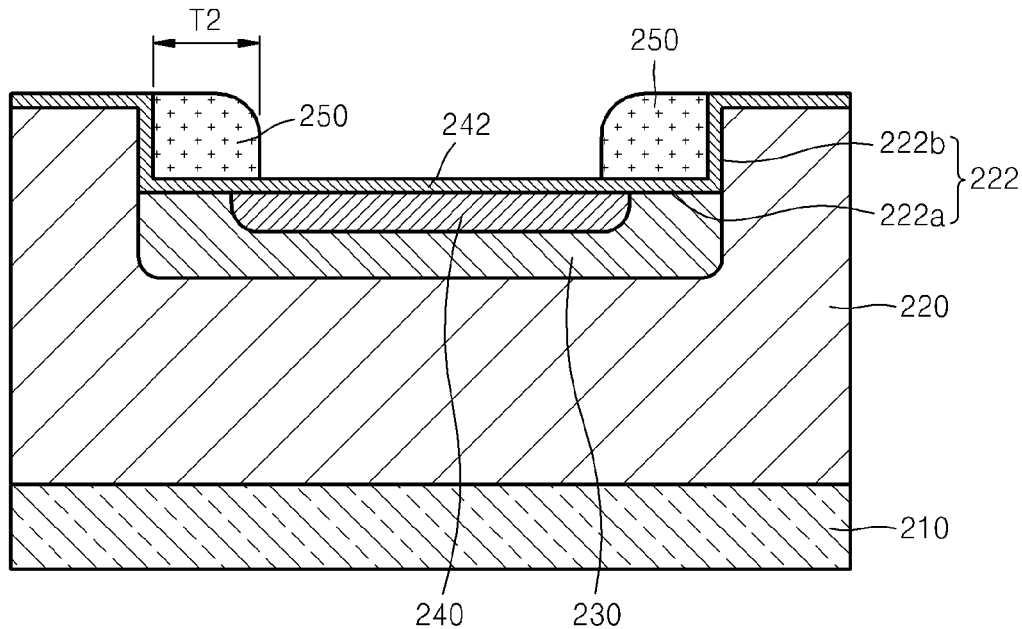

Referring to FIG. 3E, a polysilicon layer is deposited on the gate insulation layer 242 to a second thickness T2. A side wall spacer 250 is formed at each of the corners of the trench 222 facing each other, by dry etching the polysilicon layer. The height of the side wall spacer 250 may decrease as a distance from the side wall 222b of the trench 222 increases or may be otherwise shaped as previously indicated.

The side wall spacer 250 is a gate electrode 250. The width of the gate electrode 250 may be substantially the same as the second thickness T2. The second thickness T2 may be greater than the first thickness T1. Since the second thickness T2 may be greater than the first thickness T1, the gate electrode 250 is formed on a part of the n+ source region 240.

Figure 3F:
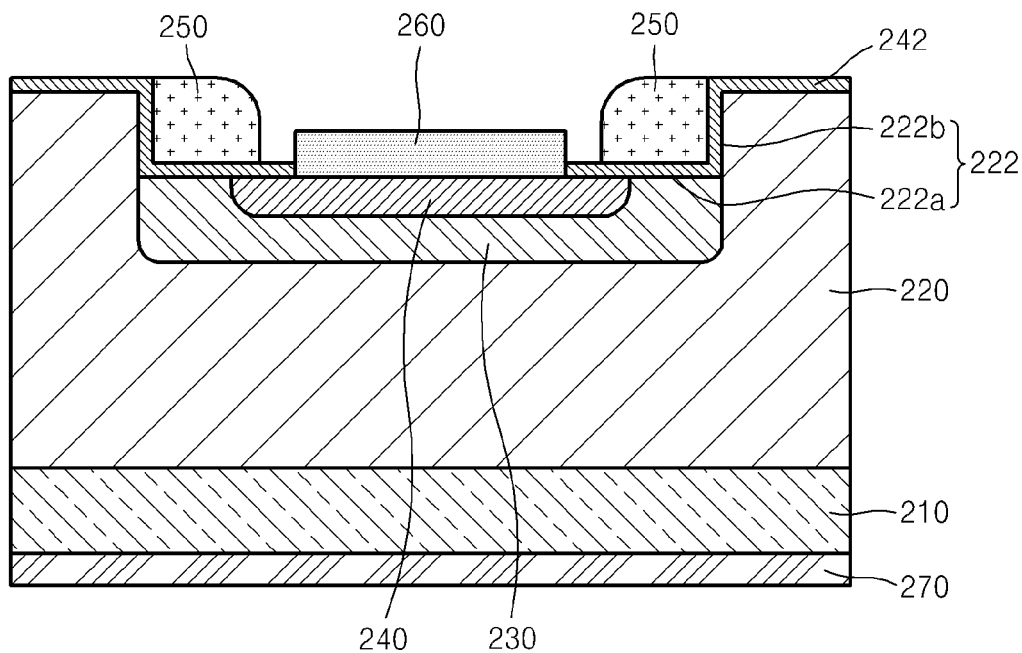

Referring to FIG. 3F, the n+ source region 240 is exposed by patterning the gate insulation layer 242 on the bottom 222a of the trench 222. A source electrode 260 is formed on the n+ source region 240 that is exposed. A drain electrode 270 is formed under the semiconductor substrate 210. The source electrode 260 and the drain electrode 270 may be formed, for example, by depositing aluminum (Al), gold (Au), beryllium (Be), bismuth (Bi), cobalt (Co), copper (Cu), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), tungsten (W), zinc (Zn), or zirconium (Zr).

In the above embodiment, only one trench is formed. In other embodiments, a plurality of trenches may be formed and a source electrode pad for connecting a plurality of source electrodes may be formed when the source electrodes are formed in each trench. Also, when gate electrodes are formed in the trenches, a gate electrode pad connected to the gate electrodes may be formed together. The source electrode pad and the gate electrode pad may be formed on the same plane as the source electrodes and the gate electrodes According to example embodiments of the manufacturing method, a p-well is therefore formed under a trench by using the trench formed in a drift layer and an n+ source region is formed by using a spacer formed on a side wall of the trench, and the n+ source region is self-aligned to the p-well. Also, since a gate electrode is formed on the side wall of the trench, the gate electrode is self-aligned. Thus, gate electrodes may be aligned in a relatively narrow area.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A semiconductor device comprising:
   a semiconductor substrate doped with a first type impurity;
   a drift layer on a first surface of the semiconductor substrate and doped with the first type impurity, the drift layer having a trench;
   a well from a top surface of the drift layer exposed by the trench to a given depth in the drift layer, the well being doped with a second type impurity;
   a source region from a top surface of the well to a given depth in the well, the source region being doped with the first type impurity;
   a gate insulation layer on the trench;
   at least one gate electrode on the gate insulation layer, the at least one gate electrode on a side wall of the trench extending toward an opposite side wall of the trench to overlap a portion of the source region;
   a source electrode on a bottom surface of the trench to contact the source region and separated from the at least one gate electrode; and
   a drain electrode on a second surface of the semiconductor substrate.

2. The semiconductor device of claim 1, wherein the semiconductor substrate is made from a material including silicon carbide.

3. The semiconductor device of claim 1, wherein the at least one gate electrode has a height that decreases as a distance from the side wall of the trench increases.

4. The semiconductor device of claim 1, wherein
   the first type impurity is an n-type impurity, and
   the second type impurity is a p-type impurity.

5. The semiconductor device of claim 1, wherein the trench has a width larger than a depth.

6. The semiconductor device of claim 1, wherein the at least one gate electrode comprises:
   a pair of gate electrodes on respective sidewalls of the trench to face each other,
   the source electrode between the pair of gate electrodes, and
   the pair of gate electrodes electrically connected to each other.

7. The semiconductor device of claim 1, wherein
   the source region is self-aligned to the well, and
   the gate electrode is self-aligned to the well and the source region.

8. The semiconductor device of claim 1, further comprising:
   a plurality of trenches, each trench including a source electrode between a pair of gate electrodes, the pair of gate electrodes on respective sidewalls of the trench to face each other;
   a source electrode pad connected to the source electrode in each trench; and
   a gate electrode pad connecting the gate electrodes in each trench.

9. The semiconductor device of claim 8, wherein the source electrode pad and the gate electrode pad are arranged on substantially a same plane.

10. The semiconductor device of claim 1, wherein the semiconductor device is a power MOSFET.

11. A method of manufacturing a semiconductor device, comprising:
    forming a drift layer on a first surface of a semiconductor substrate, the drift layer and semiconductor substrate doped with a first type impurity;
    forming a trench in the drift layer;

forming a well in a top surface of the drift layer exposed by the trench to a given depth in the drift layer, the well overlapping the trench and doped with a second type impurity;

forming a source region from a top surface of the well to a given depth in the well, the source region being doped with the first type impurity;

forming a gate insulation layer on the trench;

forming at least one gate electrode on the gate insulation layer, the at least one gate electrode on a side wall of the trench extending toward an opposite sidewall of the trench to overlap a portion of the source region;

forming a source electrode on a bottom surface of the trench to contact the source region and separated from the at least one gate electrode; and forming a drain electrode on a second surface of the semiconductor substrate.

12. The method of claim 11, wherein forming the trench comprises forming the trench to have a width greater than a depth.

13. The method of claim 11, wherein forming the source region comprises:

forming an oxide film having a first thickness on the drift layer;

forming a first side wall spacer on the side wall of the trench; and forming the source region by doping the first type impurity on the well exposed to the first side wall spacer.

14. The method of claim 13, wherein forming the at least one gate electrode comprises:

removing the first side wall spacer;

forming a polysilicon layer to a second thickness on the gate insulation layer; and forming at least a second side wall spacer of polysilicon on the side wall of the trench, wherein the second thickness is larger than the first thickness.

15. The method of claim 14, wherein forming the gate insulation layer comprises performing a thermal treatment on the drift layer.

16. The method of claim 11, wherein the semiconductor substrate and the drift layer are made of a material which includes silicon carbide.

17. The method of claim 11, wherein
the first type impurity is an n-type impurity, and
the second type impurity is a p-type impurity.

18. The method of claim 11, wherein the at least one gate electrode is a plurality of gate electrodes, further comprising:

forming a plurality of trenches in the drift layer substantially parallel to one another, each of the plurality of trenches including the source electrode and one of the plurality of gate electrodes;

forming a source electrode pad connected to the source electrodes in each of the plurality of trenches; and forming a gate electrode pad connected to the one of the plurality of gate electrodes in each of the plurality of trenches.

19. The method of claim 18, wherein forming the source electrode pad and forming the gate electrode pad comprise forming the source electrode pad and the gate electrode pad on substantially a same plane.

\* \* \* \* \*